United States Patent
Ham et al.

(10) Patent No.: US 9,978,567 B2
(45) Date of Patent: May 22, 2018

(54) APPARATUS AND METHOD OF TREATING A SUBSTRATE

(71) Applicant: SEMES CO., LTD., Cheonan-si, Chungcheongnam-do (KR)

(72) Inventors: Yong-Hyun Ham, Bucheon-si (KR);
Hyung Je Woo, Seongnam-si (KR);
Hyun Joong Kim, Seongnam-si (KR);
Wan-Jae Park, Hwanseong-si (KR);
Kyu Young Han, Seoul (KR)

(73) Assignee: SEMES Co., Ltd., Chungcheongnam-do (KR)

( * ) Notice: Subject to any disclaimer, the term of this patent is extended or adjusted under 35 U.S.C. 154(b) by 468 days.

(21) Appl. No.: 14/607,816

(22) Filed: Jan. 28, 2015

(65) Prior Publication Data

US 2015/0214016 A1    Jul. 30, 2015

(30) Foreign Application Priority Data

Jan. 29, 2014  (KR) .................. 10-2014-0011181

(51) Int. Cl.
| H01J 37/32 | (2006.01) |
| C23C 16/44 | (2006.01) |
| H01L 21/00 | (2006.01) |

(52) U.S. Cl.
CPC .... *H01J 37/32862* (2013.01); *C23C 16/4401* (2013.01); *C23C 16/4405* (2013.01); *H01J 37/32935* (2013.01); *H01J 37/32972* (2013.01); *H01L 21/00* (2013.01); *H01L 2221/00* (2013.01)

(58) Field of Classification Search
None
See application file for complete search history.

(56) References Cited

U.S. PATENT DOCUMENTS 6,650,409 B1 * 11/2003 Noguchi ............ G01N 21/9501
356/237.3
2006/0228473 A1 * 10/2006 Satoh .................... B08B 7/0035
427/248.1

FOREIGN PATENT DOCUMENTS

| CN | 101958232 A | * | 1/2011 |
| CN | 101958232 A |   | 1/2011 |
| JP | S61129830 A |   | 6/1986 |
| JP | H0412251 A  |   | 1/1992 |
| JP | 2002-057149 A |  | 2/2002 |
| KR | 10027082    |   | 3/2001 |
| KR | 20030096412 A |  | 12/2003 |
| KR | 10052521    |   | 10/2005 |
| KR | 10068898    |   | 3/2007 |

(Continued)

OTHER PUBLICATIONS

Derwent CN 101958232 abstract, retrieved Aug. 13, 2017.*

*Primary Examiner* — Eric W Golightly
(74) *Attorney, Agent, or Firm* — Harness, Dickey & Pierce, P.L.C.

(57) ABSTRACT

Provided are an apparatus and a method of treating a substrate using process gas. The apparatus may include a chamber configured to provide a treatment space, in which a process of treating a substrate is performed, a detection unit configured to detect an amount of reaction by-products attached on an inner surface of the chamber. The detection unit may include a window member provided on the inner surface of the chamber, and a light source member configured to emit and receive light through the window member.

4 Claims, 6 Drawing Sheets

(56) References Cited

FOREIGN PATENT DOCUMENTS

| KR | 10-0709036 B1 | 4/2007 |
|----|---------------|--------|
| WO | WO-02/12585 A2 | 2/2002 |

\* cited by examiner

FIG. 1

PRIOR ART

FIG. 2

PRIOR ART

APPARATUS AND METHOD OF TREATING A SUBSTRATE

CROSS-REFERENCE TO RELATED APPLICATIONS

This U.S. non-provisional patent application claims priority under 35 U.S.C. § 119 to Korean Patent Application No. 10-2014-0011181, filed on Jan. 29, 2014, in the Korean Intellectual Property Office, the entire contents of which are hereby incorporated by reference.

BACKGROUND OF THE INVENTION

Exemplary embodiments of the inventive concept relate to an apparatus and a method of treating a substrate, and in particular, to an apparatus and a method of treating a substrate using process gas.

A semiconductor device is fabricated through several processes, such as photolithography, etching, thin-film deposition, ion implantation, and cleaning processes. Here, a substrate treating apparatus using plasma may be used to perform the etching, thin-film deposition, and cleaning processes.

Normally, a plasma treatment process may include steps of supplying process gas into a chamber and of treating a substrate using plasma generated from the process gas. However, in such a plasma treatment process, a fraction of the plasma may be attached on an inner surface of the chamber, thereby serving as a particle source. Accordingly, a cleaning process may be performed to preserve a desired clean level of an internal space of the chamber, before and/or after the plasma process.

Figure 1:
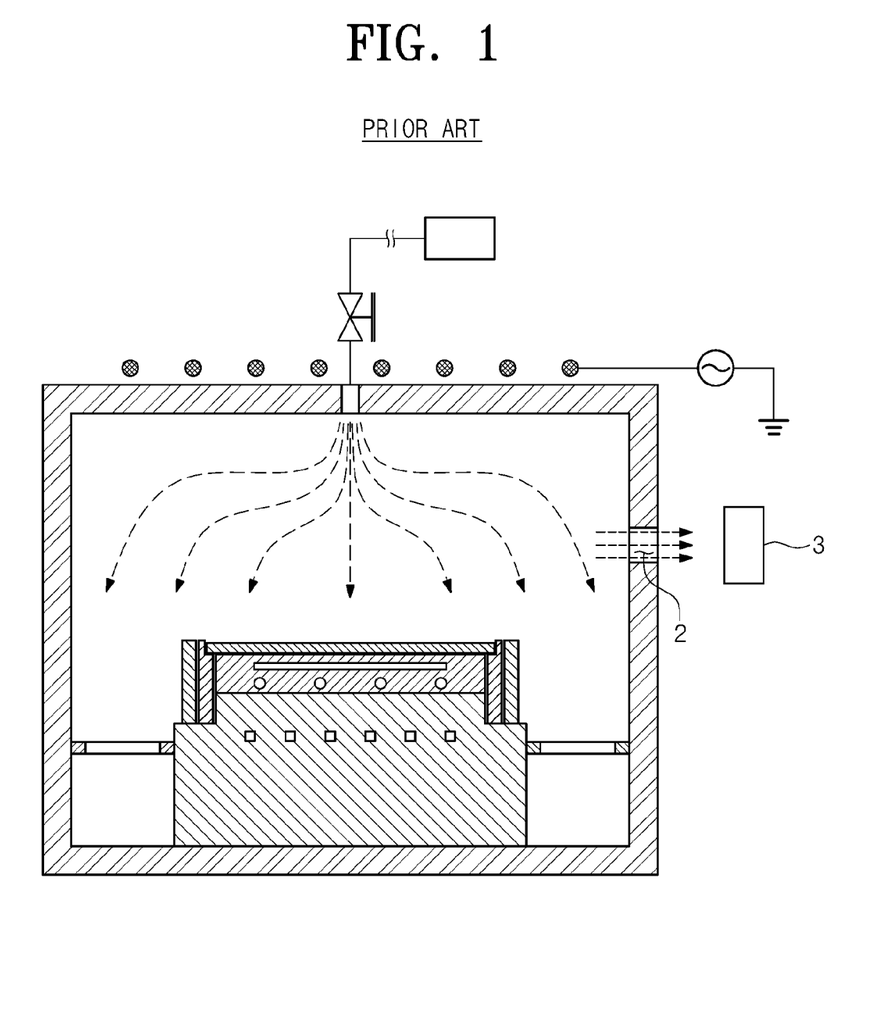
FIGS. 1 and 2 are sectional views illustrating a conventional substrate treating apparatus.
Figure 2:
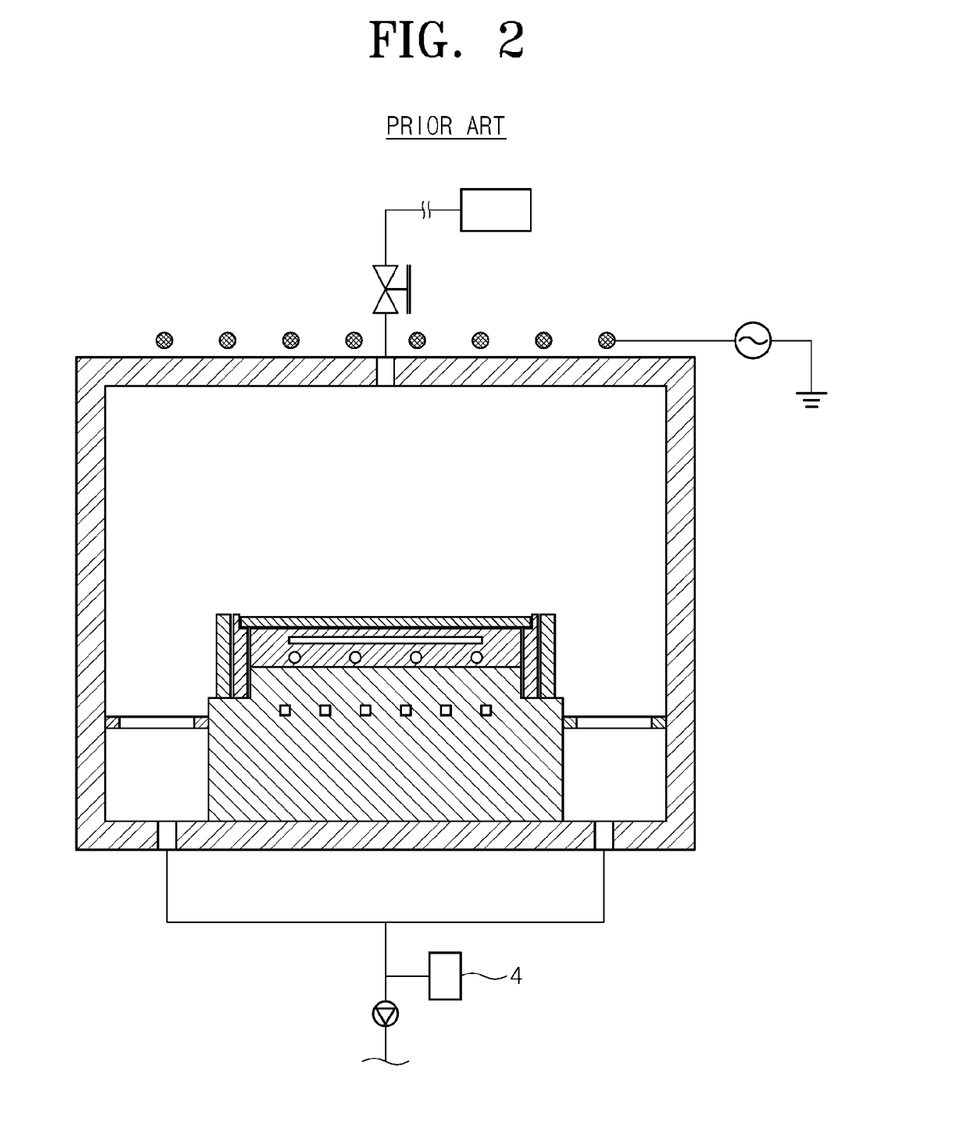

The cleaning process may include steps of supplying cleaning gas into the chamber and of measuring a state of plasma generated in the chamber. FIGS. 1 and 2 are sectional views illustrating a substrate treating apparatus according to a conventional technology. Referring to FIGS. 1 and 2, a transparent window 2 may be provided through a sidewall of a chamber, and a sensor 3 may be provided near the transparent window 2 to measure a plasma state in the chamber state and monitor a corresponding cleaning state. Alternatively, a sensor 4 may be used to examine the composition of process by-products, which may be produced in the chamber, when the process by-products are exhausted. The cleaning state of the chamber may be determined based on the examined composition.

However, in the case where the cleaning state of the chamber is examined using the afore-described methods, it is difficult to properly monitor the actual cleaning state of the inner surface of the chamber.

RELEVANT PUBLISHED DOCUMENTS

Korean Patent Publication No. 2003-0096412

SUMMARY

Example embodiments of the inventive concept provide an apparatus and a method capable of examining a state of an inner surface of a chamber with higher accuracy.

Other example embodiments of the inventive concept provide an apparatus and a method capable of cleaning an inner surface of a chamber and preserving a state of the inner surface of the chamber to a pre-determined condition.

According to example embodiments of the inventive concept, a substrate treating apparatus may include a chamber configured to provide a treatment space, in which a process of treating a substrate is performed, a detection unit configured to detect an amount of reaction by-products attached on an inner surface of the chamber. The detection unit may include a window member provided on the inner surface of the chamber, and a light source member configured to emit and receive light through the window member.

In example embodiments, the window member may include a coating layer coated on an inner side surface thereof and formed of the same material as that of an inner surface of the chamber. An inner side surface of the coating layer may be substantially coplanar with the inner surface of the chamber. The window member may include a first view port including a first transparent window provided on a sidewall of the chamber and a second view port including a second transparent window provided on the sidewall of the chamber to face the first view port. The light source member may include a light-emitting device provided outside the first transparent window and configured to emit light, and a light-receiving device provided outside the second transparent window and configured to receive light emitted from the light-emitting device.

In other embodiments, the window member may include a transparent window provided on a sidewall of the chamber. The light source member may include a light-emitting device provided outside the transparent window and configured to emit light, and a light-receiving device provided outside the transparent window and configured to receive light reflected from the transparent window.

In example embodiments, the substrate treating apparatus may further include a gas-supplying unit including a gas-supplying line, which is configured to supply cleaning gas to the treatment space, and a valve, which is configured to open and close the gas-supplying line, and a plasma source configured to generate plasma from the cleaning gas to be supplied into the treatment space. The detection unit may include a controller controlling the light source member and the gas-supplying unit, and the controller may be configured to control a cleaning process, which is performed to clean the treatment space before and/or after the process of treating the substrate, until detection information obtained by the light-receiving device may be coincident with a pre-determined condition. Here, the pre-determined condition may include information on an inner surface state of the chamber.

According to example embodiments of the inventive concept, a method of treating a substrate may include emitting and receiving light through a window member provided on an inner surface of a chamber, in which a plasma treatment process may be performed, to detect an amount of reaction by-products attached on the inner surface.

In example embodiments, the window member may include a coating layer coated on an inner side surface thereof and formed of the same material as that of the inner surface. An inner side surface of the coating layer may be substantially coplanar with the inner surface. The method may further include comparing the detection information on an amount of reaction by-products with a pre-determined condition, supplying cleaning gas into the chamber to perform a cleaning treatment on an internal space of the chamber, if the detection information is not coincident with the pre-determined condition, and terminating the supplying of the cleaning gas, if the detection information is coincident with the pre-determined condition.

According to example embodiments of the inventive concept, a method of treating a substrate may include a cleaning treatment step of cleaning an internal space of a chamber, in which a treatment process may be performed, a substrate treatment step of supplying process gas into the chamber to treat a substrate. The cleaning treatment step may include a cleaning gas supplying step of supplying cleaning gas into the chamber, a detecting step of emitting and receiving light through a window member provided on an inner surface of the chamber and detecting an amount of reaction by-products attached on the inner surface.

In example embodiments, the cleaning treatment step may further include comparing information on an amount of reaction by-products with a pre-determined condition, supplying cleaning gas into the chamber to clean an internal space of the chamber, if the detection information is not coincident with the pre-determined condition, and terminating the supplying of the cleaning gas, if the detection information is coincident with the pre-determined condition. The cleaning treatment step and the substrate treatment step may be alternatingly performed.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, an apparatus and a method of treating a substrate using process gas will be described. However, example embodiments of the inventive concept may not be limited thereto. For example, the inventive concept can be applied to any process and apparatus using plasma.

Hereinafter, exemplary embodiments of the inventive concept will be described with reference to FIGS. 3 through 7.

Figure 3:
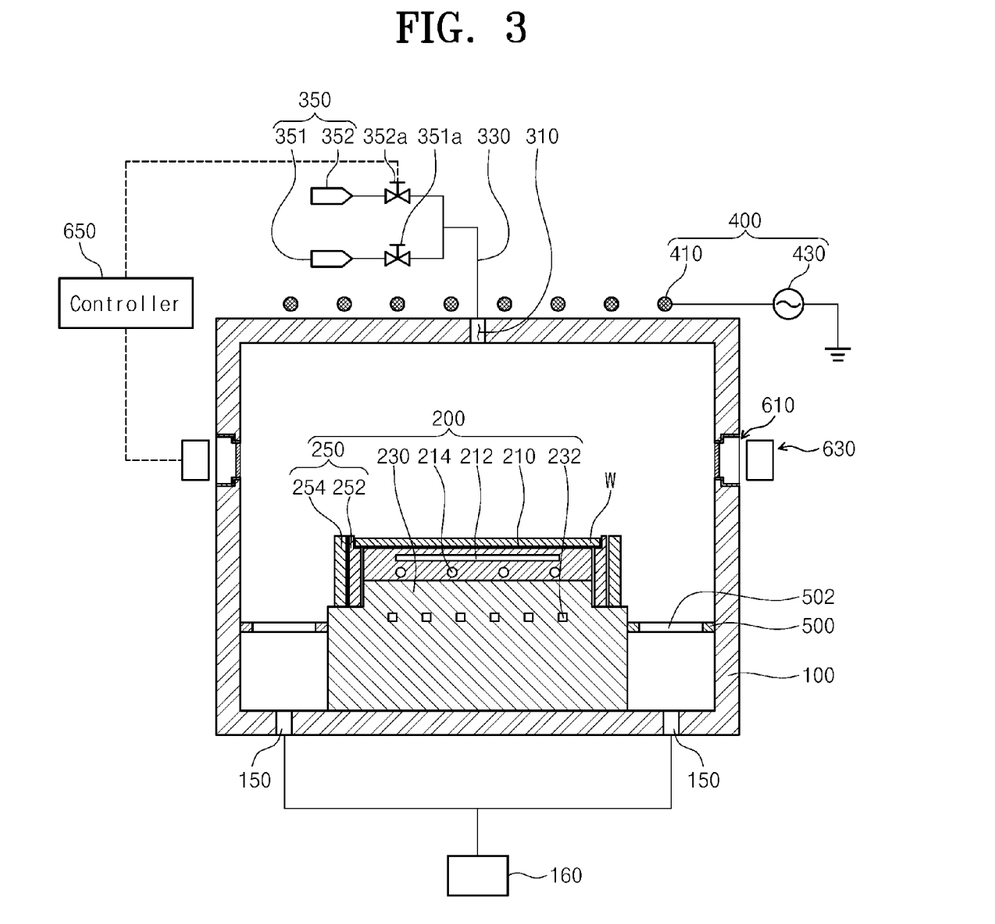
FIG. 3 is a sectional view illustrating a substrate treating apparatus, according to exemplary embodiments of the inventive concept.

FIG. 3 is a sectional view illustrating a substrate treating apparatus, according to exemplary embodiments of the inventive concept. Referring to FIG. 3, a substrate treating apparatus 10 may include a chamber 100, a substrate-supporting unit 200, a gas-supplying unit 300, a plasma source 400, a baffle 500, and a detection unit 600.

The chamber 100 may be configured to provide a treatment space, in which a substrate W is treated. The chamber 100 may be provided in the form of a cylinder. The chamber 100 may be formed of or include a metal-based material. For example, the chamber 100 may be formed of an aluminum-based material. An exhaust hole 150 may be formed in a bottom surface of the chamber 100. The exhaust hole 150 may be connected to a pressure-reducing member 160 through an exhausting line. The pressure-reducing member 160 may be configured to provide a vacuum pressure to the exhaust hole 150 through the exhausting line. The vacuum pressure may allow process by-products and/or plasma remaining in the chamber 100 to be exhausted to the outside of the chamber 100.

The substrate-supporting unit 200 may be disposed in the treatment space to support the substrate W loaded therein. The substrate-supporting unit 200 may support the substrate W using an electrostatic force. In other words, the substrate-supporting unit 200 may serve as an electrostatic chuck 200. In certain embodiments, the substrate-supporting unit 200 may be configured to support the substrate W using other means (e.g., with a mechanical clamp).

The electrostatic chuck 200 may include a dielectric plate 210, a focus ring 250, and a base 230. The substrate W may be directly loaded on a top surface of the dielectric plate 210. The dielectric plate 210 may be provided in the form of a circular disk. The dielectric plate 210 may have a radius smaller than that of the substrate W. A lower electrode 212 may be equipped in the dielectric plate 210. The lower electrode 212 may be connected to a power supply (not shown) and may be supplied with an electric power provided from the power supply (not shown). The lower electrode 212 may produce an electrostatic force from the supplied electric power (not shown), and the electrostatic force may be used to electrically attach the substrate W onto the dielectric plate 210. In example embodiments, the lower electrode 212 may be provided in the form of a monopolar electrode. A heater 214 may be provided in the dielectric plate 210 to heat the substrate W. The heater 214 may be disposed below the lower electrode 212. The heater 214 may be provided in the form of a spiral coil. The dielectric plate 210 may be formed of or include, for example, a ceramics-based material.

The base 230 may support the dielectric plate 210. The base 230 may be provided below the dielectric plate 210 and may be fastened and coupled to the dielectric plate 210. The base 230 may be provided in such a way that a top surface thereof is higher at a central region than at an edge region. For example, the base 230 may be provided to have a staircase structure. Further, the base 230 may be configured in such a way that the top surface at the central region has substantially the same area as that of a bottom surface of the dielectric plate 210. A coolant flow passage 232 may be provided in the base 230 to circulate coolant therethrough. In the base 230, the coolant flow passage 232 may be provided to have a spiral shape. The base 230 may be coupled to a radio frequency (RF) power (not shown) located at the outside of the chamber 100. The RF power may apply an electric power to the base 230. The electric power applied to the base 230 may be used to guide plasma produced in the chamber 100 toward the base 230. The base 230 may be formed of or include a metal-based material.

The focus ring 250 may focus or concentrate plasma on the substrate W. The focus ring 250 may include an inner ring 252 and an outer ring 254. The inner ring 252 may be provided in the form of a circular ring enclosing the dielectric plate 210. The inner ring 252 may be provided on the edge region of the base 230. The inner ring 252 may have a top surface substantially coplanar with that of the dielectric plate 210. The top surface of the inner ring 252 may include an inner side portion supporting an edge region of the bottom surface of the substrate W. For example, the inner ring 252 may be formed of or include a conductive material. The outer ring 254 may be provided in the form of a circular ring enclosing the inner ring 252. The outer ring 254 may be provided on the edge region of the base 230 and adjacent to the inner ring 252. The outer ring 254 may be provided in such a way that a top surface thereof is located at a higher level than that of the inner ring 252. The outer ring 254 may be formed of or include an insulating material.

The gas-supplying unit 300 may be configured to supply process gas and cleaning gas onto the substrate W supported by the substrate-supporting unit 200. The gas-supplying unit 300 may include a process gas storage 350, a gas-supplying line 330, and a gas in-flow port 310. The process gas storage 350 may include a first gas storage 351 and a second gas storage 352. First gas may be contained or stored in the first gas storage 351, and second gas may be contained or stored in the second gas storage 352. The first and second gases may be of different kinds. The gas-supplying line 330 may connect the first gas storage 351 and the second gas storage 352 to the gas in-flow port 310. The first and second gases, which are contained in the first and second gas storages 351 and 352, respectively, may be supplied to the gas in-flow port 310 through the gas-supplying line 330. A first valve 351a and a second valve 352a may be equipped on the gas-supplying line 330. The first valve 351a may be configured to open and close a pathway for supplying the first gas, and the second valve 352a may be configured to open and close a pathway for supplying the second gas. In example embodiments, the first gas may be used as a substrate treating gas. For example, the first gas may be used as an etching gas. The second gas may be used as a cleaning gas.

The plasma source 400 may be configured to cause the process gas in the chamber 100 to be excited into a plasma state. In example embodiments, an inductively-coupled plasma (ICP) source may be used as the plasma source 400. The plasma source 400 may include an antenna 410 and an external power 430. The antenna 410 may be disposed outside or on the chamber 100. The antenna 410 may be provided to have a spiral structure with a plurality of windings and may be coupled to the external power 430. The antenna 410 may be supplied with an electric power provided from the external power 430. In the case where the electric power is applied to the antenna 410, a discharge space may be formed in the treatment space of the chamber 100. The process gas positioned in the discharge space may be excited into a plasma state.

Figure 4:
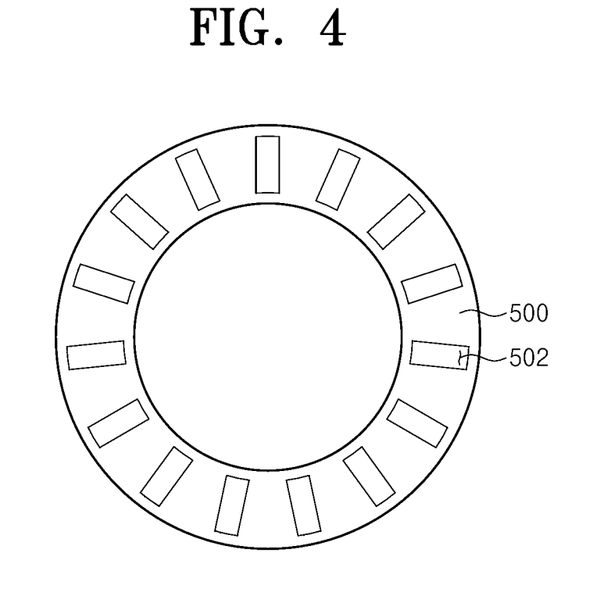
FIG. 4 is a plan view illustrating the baffle of FIG. 3.

The baffle 500 may allow the plasma to be uniformly generated in the treatment space. FIG. 4 is a plan view illustrating the baffle of FIG. 3. The baffle 500 may be provided in the treatment space and between an inner sidewall of the chamber 100 and the supporting unit 400. The baffle 500 may be provided in the form of a circular ring. The baffle 500 may have a plurality of through holes 502. The through holes 502 may be formed to penetrate the baffle 500 in a vertical direction. The through holes 502 may be provided spaced apart from each other in a circumference direction of the baffle 500. Each of the through holes 502 may be shaped like a slit. The through hole 502 may has a shape elongated in a radial direction of the baffle 500.

Figure 5:
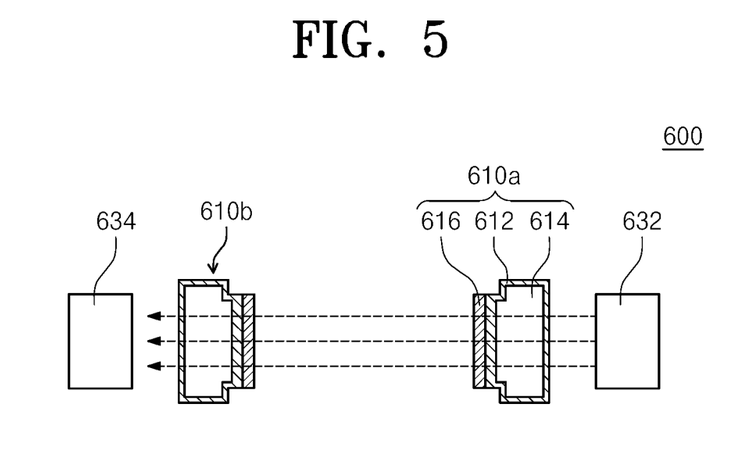
FIG. 5 is a sectional view illustrating the detection unit of FIG. 3.

The detection unit 600 may be configured to detect an amount of reaction by-products to be attached on the inner surface of the chamber 100. For example, the detection unit 600 may measure a physical state of the inner surface of the chamber 100 using light. FIG. 5 is a sectional view illustrating the detection unit 600 of FIG. 3. Referring to FIG. 5, the detection unit 600 may include a window member 610, a light source member 630, and a controller 650. The window member 610 may include a first view port 610a and a second view port 610b. In example embodiments, the first view port 610a and the second view port 610b may be provided to have the same shape. The first view port 610a may be provided on a sidewall of the chamber 100. The first view port 610a may be configured to be equipped to or be removed from a first detection hole, which is formed on a sidewall of the chamber 100. The first view port 610a may be provided at a level higher than that of the electrostatic chuck. The first view port 610a may include a first frame 612 and a first transparent window 614. The first frame 612 may be provided in the form of a ring enclosing a circumference of the first transparent window 614. The first frame 612 and the first transparent window 614 may be coupled to each other in a fastened manner. An inner side surface of the first frame 612 and the first transparent window 614 may be coated with a coating layer 616. In example embodiments, the coating layer 616 may be formed of or include the same material as the inner surface of the chamber 100. As an example, an inner side surface of the coating layer 616 may be positioned on the same plane as the inner surface of the chamber 100, and for this, the coating layer 616 may be coated on, for example, the first transparent window 614. The coating of the coating layer 616 may be performed by one of various coating apparatuses (e.g., an atomic layer deposition (ALD) system, a sputter, a spray, and an evaporator).

The second view port 610b may be provided on a sidewall of the chamber 100 positioned opposite to the first view port 610a. The second view port 610b may include a second frame and a second transparent window. The second frame and the second transparent window may be configured to have the same configuration as the first frame 612 and the first transparent window 614, respectively, and thus, a detail description thereof will be omitted.

The light source member 630 may be configured to emit and receive light through the window member 610. The light source member 630 may include a light-emitting device 632 and a light-receiving device 634. The light-emitting device 632 and the light-receiving device 634 may be arranged, outside the first view port 610a and the second view port 610b, respectively. The light-emitting device 632 may be provided adjacent to the first view port 610a, and the light-receiving device 634 may be provided adjacent to the second view port 610b. The light-emitting device 632 and the light-receiving device 634 may be provided to face each other. In the case where light is emitted from the light-emitting device 632, the light may pass through the first view port 610a and the second view port 610b and then may be incident into the light-receiving device 634.

The controller 650 may control the light-receiving device 634 and the second valve 352a. The controller 650 may control the second valve 352a, based on detection information obtained by the light-receiving device 634. The second valve 352a may be controlled by the controller 650 to obtain the detection information coincident with a pre-determined condition. As an example, in the case where the detection information is not coincident with the pre-determined condition, the controller 650 may open the second valve 352a, whereas in the case where the detection information is coincident with the pre-determined condition, the controller 650 may close the second valve 352a.

Figure 6:
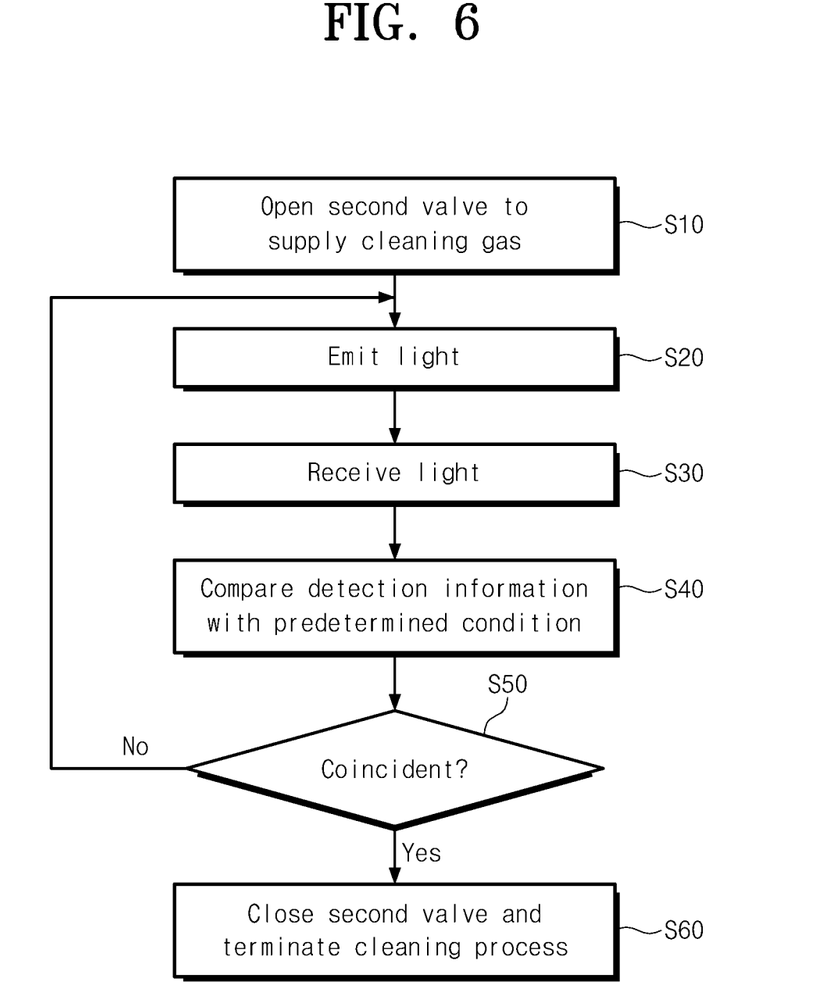
FIG. 6 is a block diagram exemplarily illustrating a process of treating a substrate using the substrate treating apparatus of FIG. 3.

Next, a method of cleaning the treatment space of the chamber 100 using the substrate treating apparatus will be exemplarily described. FIG. 6 is a block diagram exemplarily illustrating a process of treating a substrate using the substrate treating apparatus of FIG. 3. Referring to FIG. 6, the light-emitting device 632 may be configured to emit light toward the first view port 610a, and the light-receiving device 634 may be configured to receive the light through the second view port 610b. The second valve 352a may be opened to supply cleaning gas into the treatment space. The cleaning gas may contain a material capable of cleaning an inner surface of the chamber 100. If the inner surface of the chamber 100 is treated with the cleaning gas, an amount of light to be incident into the light-receiving device 634 may be changed. The controller 650 may determine whether the detection information is coincident with the pre-determined condition, based on the detection information obtained by the light-receiving device 634. If the detection information is coincident with the pre-determined condition, the controller 650 may close the second valve 352a and the cleaning process may be terminated.

Figure 7:
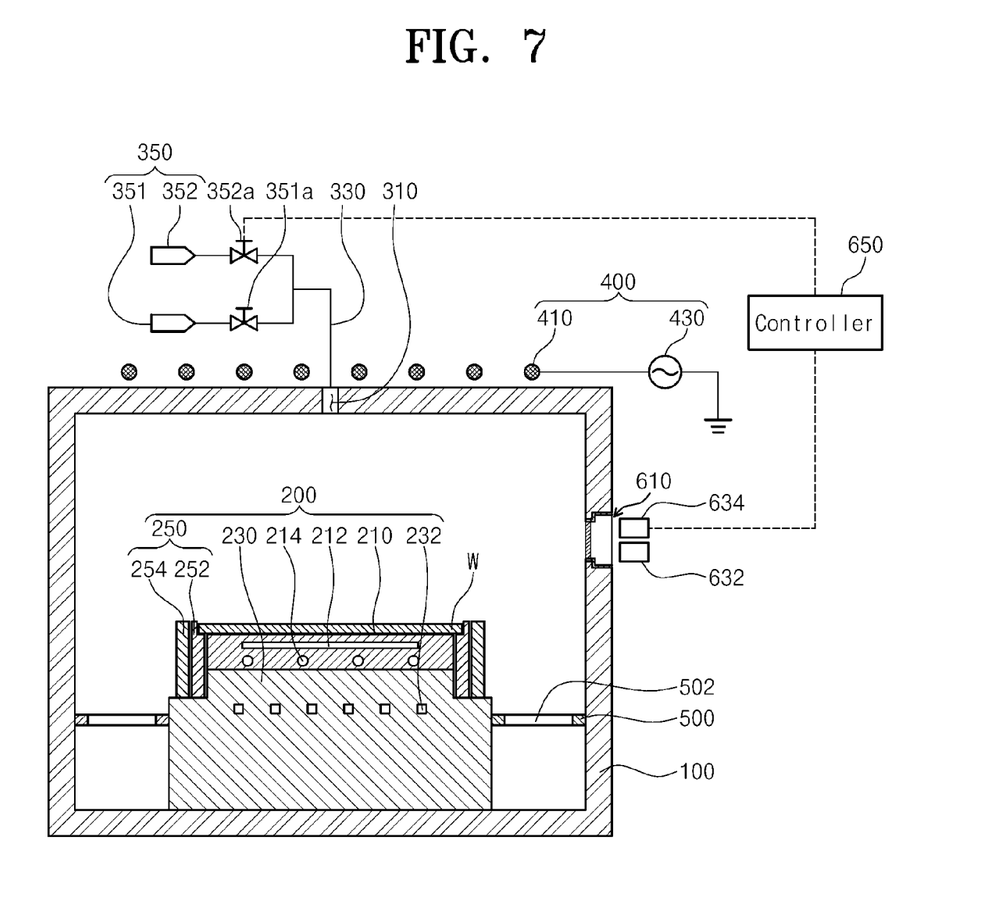
FIG. 7 is a sectional view illustrating a substrate treating apparatus, according to other exemplary embodiments of the inventive concept.

As described above, the detection unit 600 may include a plurality of view ports 610, but example embodiments of the inventive concepts may not be limited thereto. For example, as shown in FIG. 7, the view port 610 may be singly provided. The view port may be provided on a sidewall of the chamber 100, and the light-emitting device 632 and the light-receiving device 634 may be provided adjacent to the view port 610. The light-emitting device 632 may be configured to emit light through the view port 610, and the, a fraction of the emitted light may be reflected by reaction by-products deposited on a transparent window. The light-receiving device 634 may be configured to receive the reflected light, and the controller 650 may compare detection information obtained by the light-receiving device 634 with a pre-determined condition.

According to example embodiments of the inventive concept, a window member may be equipped on an inner surface of a chamber, and light may be emitted and received through the window member to measure an internal state of the chamber. Accordingly, it is possible to measure a state of the inner surface of the chamber with higher accuracy.

According to example embodiments of the inventive concept, a coating layer may be coated on an inner side surface of the window member. Here, the coating layer may be formed of the same material as that of the inner surface of the chamber. Accordingly, the inner side surface of the window member can be preserved to be the same state as that of the inner surface of the chamber, and this makes it possible to measure the state of the inner surface of the chamber with higher accuracy.

According to example embodiments of the inventive concept, an amount of reaction by-products attached on the inner surface of the chamber may be determined, based on information on light emitted and received through the window member, and a cleaning process may be performed in such a way that the information on light emitted and received is coincident with a pre-determined condition. Accordingly, the inner surface of the chamber can be maintained to the same state, even when the cleaning process is repeatedly performed.

While example embodiments of the inventive concepts have been particularly shown and described, it will be understood by one of ordinary skill in the art that variations in form and detail may be made therein without departing from the spirit and scope of the attached claims.

What is claimed is:

1. A substrate treating apparatus, comprising:
    a chamber configured to provide a treatment space, in which a process of treating a substrate is performed;
    a detection unit configured to detect an amount of reaction by-products attached on an inner surface of the chamber,
    a gas-supplying unit including a gas-supplying line, the gas-supplying unit configured to supply cleaning gas to the treatment space using a valve, the valve configured to open and close the gas-supplying line; and
    a plasma source configured to generate plasma from the cleaning gas and supply to the treatment space,
    wherein the detection unit comprises,
        a window member provided on the inner surface of the chamber, the window member including a coating layer coated on an inner side surface of the window member, the coating layer formed of a same material as that of the inner surface of the chamber, an inner side surface of the coating layer being substantially coplanar with the inner surface of the chamber,
        a light source member configured to emit and receive light through the window member, and
        a controller controlling the light source member and the gas-supplying unit, and
    wherein the controller is configured to compare detection information on an amount of reaction by-products with a pre-determined condition, and supply cleaning gas into the chamber to perform a cleaning treatment on an internal space of the chamber in response to the detection information not satisfying the pre-determined condition, and terminate supply of the cleaning gas in response to the detection information satisfying the pre-determined condition.

2. The substrate treating apparatus of claim 1, wherein the window member comprises:
    a first view port comprising a first transparent window provided on a sidewall of the chamber; and
    a second view port comprising a second transparent window provided on the sidewall of the chamber to face the first view port and
    wherein the light source member comprises:
    a light-emitting device provided outside the first transparent window and configured to emit light; and
    a light-receiving device provided outside the second transparent window and configured to receive light emitted from the light-emitting device.

3. The substrate treating apparatus of claim 1, wherein the window member comprises a transparent window provided on a sidewall of the chamber, and
    wherein the fight source member comprises:
    a light-emitting device provided outside the transparent window and configured to emit light; and
    a light-receiving device provided outside the transparent window and configured to receive light reflected from the transparent window.

4. The substrate treating apparatus of claim 1, wherein the pre-determined condition comprises information on an inner surface state of the chamber.

* * * * *